United States Patent [19]

Okamoto et al.

[11] Patent Number: 5,343,066
[45] Date of Patent: Aug. 30, 1994

[54] SEMICONDUCTOR DEVICE AND METHOD OF MANUFACTURING SAME

[75] Inventors: Yutaka Okamoto, Tokyo; Makoto Yamada, Kanagawa; Masataka Shinguu, Tokyo, all of Japan

[73] Assignee: Sony Corporation, Tokyo, Japan

[21] Appl. No.: 33,369

[22] Filed: Mar. 18, 1993

[30] Foreign Application Priority Data

Mar. 30, 1992 [JP] Japan .................. 4-103577
Mar. 31, 1992 [JP] Japan .................. 4-105406

[51] Int. Cl.⁵ .................. H01L 27/01; H01L 27/02
[52] U.S. Cl. .................. 257/393; 257/66; 257/532; 257/776; 257/903
[58] Field of Search .................. 257/393, 66, 365, 366, 257/379, 532, 773, 776, 903, 904

[56] References Cited

U.S. PATENT DOCUMENTS

5,194,749 3/1993 Meguro et al. .................. 257/903

*Primary Examiner*—Mark V. Prenty
*Attorney, Agent, or Firm*—Hill, Steadman & Simpson

[57] ABSTRACT

In a semiconductor device having a thin film transistor in which a gate insulator film and a semiconductor layer are formed on a gate electrode layer, and a portion of the semiconductor layer is connected to a specific gate electrode layer through a contact hole formed in the gate insulator film, a static random access memory is constituted by memory cells in each of which a conductive layer stacked on the upper layer side of the semiconductor layer through an insulator layer is inserted in the contact hole formed in the gate insulator film, and the portion of the semiconductor layer is electrically connected to the specific gate electrode layer through the conductive layer.

1 Claim, 7 Drawing Sheets

SEMICONDUCTOR DEVICE AND METHOD OF MANUFACTURING SAME

BACKGROUND OF THE INVENTION

1. Field of the Invention

The present invention relates to a static random access memory (SRAM) having a thin film transistor (TFT) as a load transistor. In addition, the present invention relates to a semiconductor memory device having a gate insulator film, which is different from that formed in a memory portion, in a peripheral circuit portion.

2. Description of the Prior Art

In a semiconductor device such as an SRAM, a TFT is used as a load transistor to obtain a high integration level. In the SRAM, a driver transistor and a selector transistor are formed on the surface of a semiconductor substrate, and a thin film such as a semiconductor layer is formed on these transistors through an interlayer insulator, thereby forming a TFT serving as a load transistor. The TFT used as the load transistor of the SRAM has a bottom gate structure in which a gate electrode layer is formed on the lower layer side of a semiconductor layer through a gate insulator film.

In the steps in manufacturing the SRAM, since a portion of a polysilicon layer constituting the semiconductor layer must be connected to a specific gate electrode layer located on the lower layer side of the semiconductor layer, a contact hole is formed in the gate insulator film, and the polysilicon layer serving as the semiconductor layer is stacked on the gate insulator film by CVD or the like to be inserted in the contact hole. In this case, before the polysilicon layer serving as the semiconductor layer is formed by CVD, a native oxide formed on the surface of the gate electrode layer exposed in the contact hole must be removed by photo-etching.

However, the light etching causes the following problem. That is, a silicon oxide film constituting the gate insulator film is dipped in a photo-etching solution to degrade the quality of the gate insulator film.

When the thickness of the polysilicon layer constituting the semiconductor layer is decreased to suppress a leakage current from the TFT serving as the load transistor, since the polysilicon layer is also used as a power supply line connected to the TFT, the wiring resistance of the power supply line is increased, and the ON current of the TFT is disadvantageously decreased.

In addition, as the memory cell size of the SRAM is decreased, the capacitance of a storage node is decreased, and a resistance to soft errors is decreased.

A transistor having a breakdown voltage higher than that of each of memory cells may be formed at a portion of a peripheral circuit, arranged around a region having the memory cells, for driving the memory. In the high voltage transistor, since a high electric field is applied to a gate insulator film, the gate insulator film has a thickness larger than that of a transistor having a normal power supply voltage. However, even when the thickness of the gate insulator film of the high voltage transistor is different from that of a normal transistor, the high voltage transistor and the normal transistor have different subthreshold voltages. Therefore, an impurity is selectively ion-implanted in the semiconductor substrate to control both the transistors to have almost equal threshold voltages.

Figure 1A:
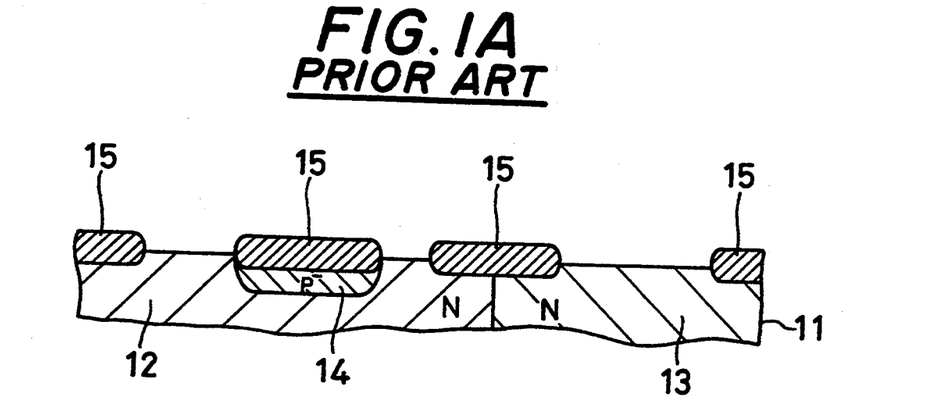
FIGS. 1A to 1F are sectional side views showing the steps in manufacturing a conventional semiconductor device having different gate insulator films.

FIGS. 1A to 1F show a conventional method of manufacturing a semiconductor device having a P-channel high voltage transistor and a P-channel normal transistor. In this conventional method, as shown in FIG. 1A, wells 12 and 13 are formed in an Si substrate 11 as a region for forming the high voltage transistor and a region for forming the normal transistor, respectively. Although the wells 12 and 13 are of an N type, the well 12 has a concentration lower than that of the well 13.

Figure 1B:
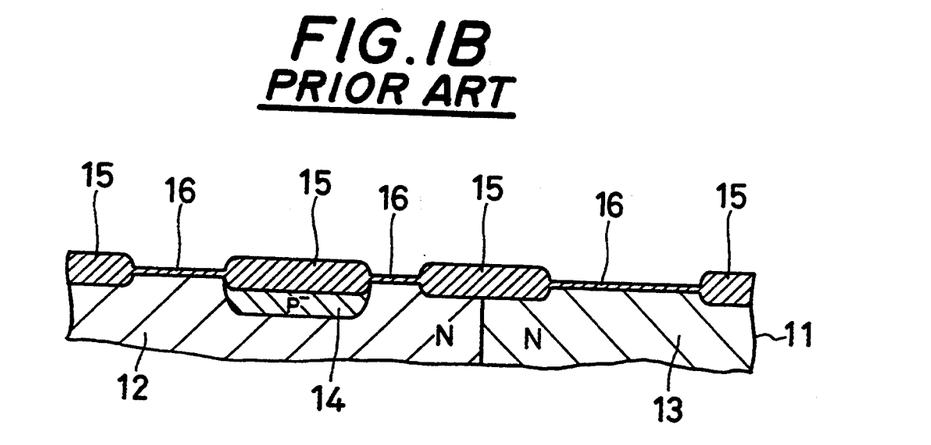

Thereafter, a P$^-$-type diffused layer 14 is formed in the well 12 to extend a depletion layer formed by a drain voltage in the high voltage transistor. Local oxidation is performed to the resultant structure to form an $SiO_2$ film 15 serving as a field oxide, and gate oxidation is performed to the resultant structure to form an $SiO_2$ film 16 having a thickness of about 200 Å as shown in FIG. 1B.

Figure 1C:
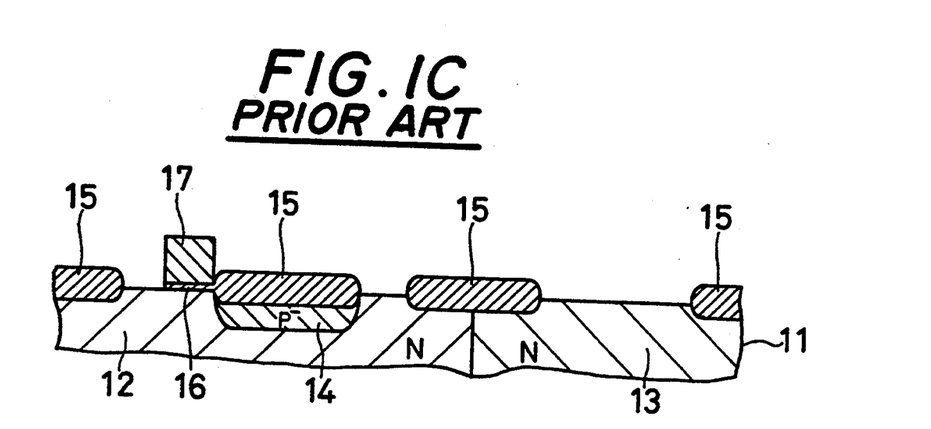

As shown in FIG. 1C, a resist 17 is patterned to cover only a region of the $SiO_2$ film 16 on which the gate oxide of the high voltage transistor is to be formed. The resultant structure is etched using the resist 17 as a mask to selectively remove the $SiO_2$ film 16.

Figure 1D:
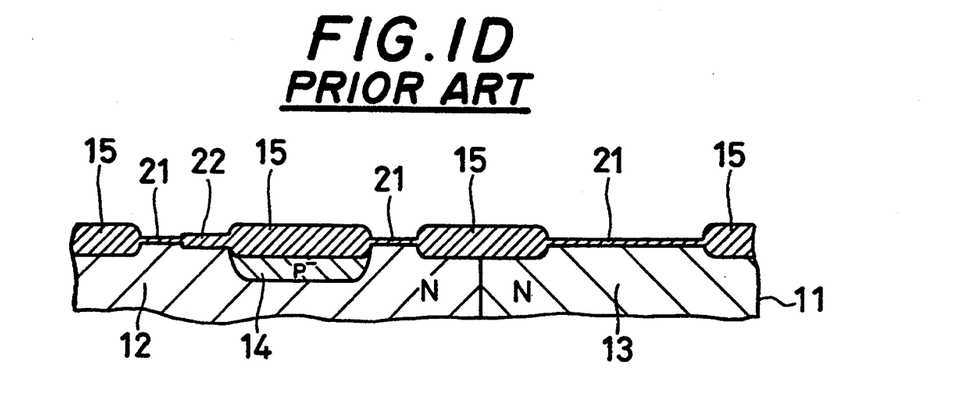

After the resist 17 is removed, gate oxidation is performed to the resultant structure again, and as shown in FIG. 1D, an $SiO_2$ film 21 having a thickness of about 200 Å is formed in a region from which the $SiO_2$ film 16 is removed. At the same time, an $SiO_2$ film 22 having a thickness of about 300 Å is formed by the remaining $SiO_2$ film 16.

Figure 1E:
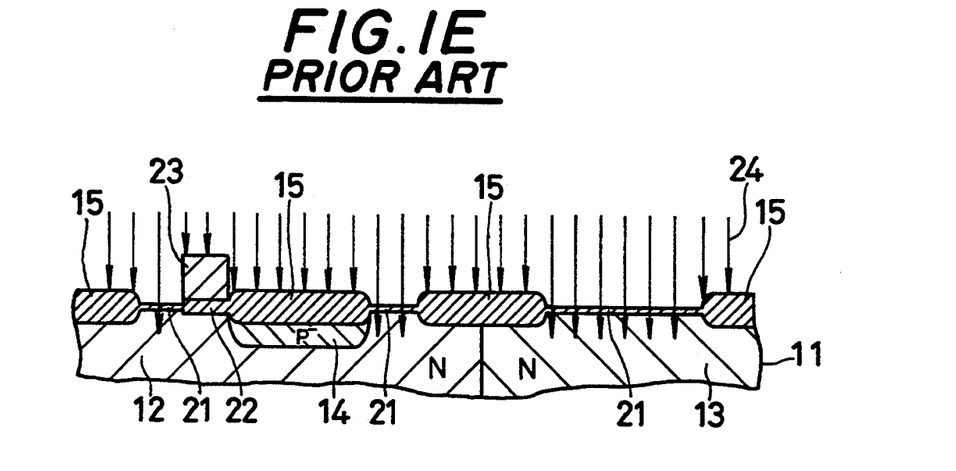

As shown in FIG. 1E, a resist 23 is patterned to cover only a region prospectively serving as the channel region of the high voltage transistor. Boron 24 is ion-implanted in the Si substrate 11 using the resist 23 and the $SiO_2$ film 15 as masks to control the threshold voltage of the normal transistor to be formed in the well 13.

In the high voltage transistor, the impurity concentration of the well 12 is determined at the beginning such that a desired threshold voltage is obtained with respect to the thickness of the $SiO_2$ film 22 without ion implantation of the boron 24. In contrast to this, the threshold voltage of the normal transistor to be formed in the well 13 and the threshold voltage of an N-channel transistor (not shown) are simultaneously controlled by the ion implantation of the boron 24. For this reason, since the impurity concentration of the well 13 is excessively high with respect to the thickness of the $SiO_2$ film 21 to obtain a desired threshold voltage, the boron 24 is ion-implanted in the well 13.

Figure 1F:
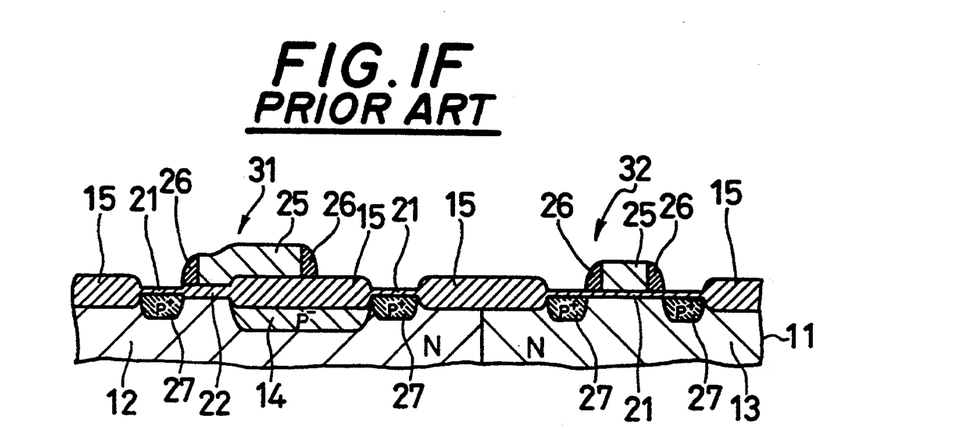

As shown in FIG. 1F, after the resist 23 is removed, a poly-Si film 25 is deposited on the entire surface of the resultant structure by CVD, an impurity is doped in the poly-Si film 25, and the poly-Si film 25 is patterned to form gate electrodes. Sidewalls constituted by $SiO_2$ films 26 are formed on the side surfaces of the poly-Si films 25.

Boron or the like is ion-implanted in the resultant structure using the poly-Si films 25 and the $SiO_2$ films 15 and 26 as masks to form P$^+$-type diffused layers 27 serving as the source/drain regions of the transistors in the wells 12 and 13. Thereafter, an Al electrode wiring or the like are formed in the conventionally known steps. In this manner, a high voltage transistor 31 and a normal transistor 32 are formed in the wells 12 and 13, respectively.

However, in the prior art shown in FIGS. 1A to 1F, as is apparent from the steps in FIGS. 1C to 1E, when the SiO film 16 is to be etched to cause the thicknesses of the gate oxides of both the transistors to be different from each other, and the boron 24 is to be ion-implanted to control the threshold voltage of the normal transistor, the different resists 17 and 23 are used as masks. For this reason, the number of steps of forming and removing the masks is large, and the number of additional steps required for forming the high voltage transistor 31 and the normal transistor 32 on the same chip is increased, thereby increasing production cost.

OBJECTS AND SUMMARY OF THE INVENTION

The present invention has been made in consideration of the above circumstances. It is a first object of the present invention to prevent the film quality of the gate insulator film of a TFT from being degraded. In addition, it is a second object of the present invention to decrease the wiring resistance of a power supply line connected to the TFT to prevent the ON current of the TFT from being decreased. It is a third object of the present invention to assure the capacitance of a storage node in a SRAM to increase a resistance to soft errors. It is a fourth object of the present invention to form a peripheral circuit and a memory cell which have gate insulator films having different thicknesses to form a transistor used in the memory cell having an optimal film thickness.

In order to achieve the first object of the present invention, in the first semiconductor device of the present invention having a thin film transistor in which a gate insulator film and a semiconductor layer are stacked on a gate electrode layer, and a portion of the semiconductor layer is connected to a specific gate electrode layer through a contact hole formed in the gate insulator film, a conductive layer stacked on the upper layer side of the semiconductor layer through an insulator layer is inserted in the contact hole formed in the gate insulator film, and the portion of the semiconductor layer is electrically connected to the specific gate electrode layer through the conductive layer.

In order to achieve the second object of the present invention, in the second semiconductor device of the present invention, the conductive layer is also formed on the upper layer side of a power supply line connected to a load transistor, and the conductive layer is used as a shunt line of the power supply line.

In order to achieve the third object of the present invention, in the third semiconductor device of the present invention, the conductive layer is used as a capacitor electrode layer for a storage node.

The conductive layer may be formed on the upper layer side of the channel region of the semiconductor layer through an insulator layer. In this case, a thin film transistor has a double-gate structure.

In addition, in order to achieve the fourth object of the present invention, first and second transistors 31 and 32 having different drain breakdown voltages are integrally formed on the same semiconductor chip. The step of causing the thicknesses of gate insulator films 22 and 21 of the first and second transistors 31 and 32 to be different from each other and the step of controlling the threshold voltages of the first and second transistors 31 and 32 are performed by using the same mask 17.

In the first semiconductor device of the present invention, the portion of the semiconductor layer is electrically connected to the specific gate electrode layer through the conductive layer stacked on the upper layer side of the semiconductor layer through the insulator layer. For this reason, in the manufacturing process of the first semiconductor device, the gate insulator film need not be lightly etched before the semiconductor layer is formed.

In the second semiconductor device of the present invention, the conductive layer is also formed on the upper layer side of the power supply line connected to the load transistor, and the conductive layer is used as the shunt line of the power supply line, thereby decreasing the wiring resistance of the power supply line.

In the third semiconductor device of the present invention, since the conductive layer is used as the capacitor electrode layer for the storage node, the capacitance of the storage node is increased.

In the fourth semiconductor device of the present invention, the step of causing the thicknesses of the gate insulator films 22 and 21 in the first and second transistors 31 and 32 to be different from each other and the step of controlling the threshold voltages of the transistors are performed by using the same mask 17. Therefore, the number of steps of forming and removing the mask of the fourth semiconductor device is smaller than that when these steps are performed by different masks.

DETAILED DESCRIPTION OF THE PREFERRED EMBODIMENTS

Semiconductor devices according to the embodiments of the present invention will be described below with reference to the accompanying drawings.

FIGS. 2 to 4E show an embodiment obtained by applying the present invention to a SRAM.

An equivalent circuit of a memory cell of an SRAM using TFTs according to an embodiment of the present invention is basically the same as an equivalent circuit of a memory cell for a 6-element SRAM conventionally used. The equivalent circuit of the SRAM using the TFTs will be briefly described below on the basis of FIG. 3.

Figure 3:
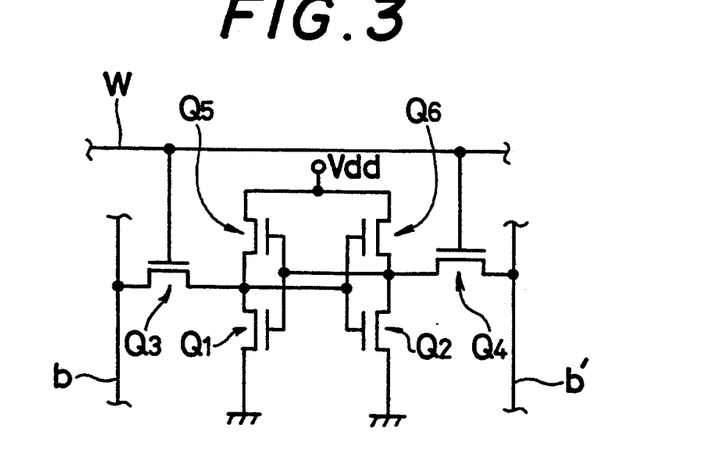
FIG. 3 is an equivalent circuit diagram showing a memory cell of the SRAM.

As shown in FIG. 3, a memory cell of the SRAM using the TFTs as load transistors has a pair of driver transistors Q1 and Q2 constituting a flip-flop circuit, selector transistors Q3 and Q4 for selecting a memory cell and load transistors Q5 and Q6. The selector transistors Q3 and Q4 are turned on in accordance with a gate voltage generated by a word line W to transmit data stored in the flip-flop circuit formed by the driver transistors Q1 and Q2 to a bit line b and an inverting bit line b'.

Figure 2:
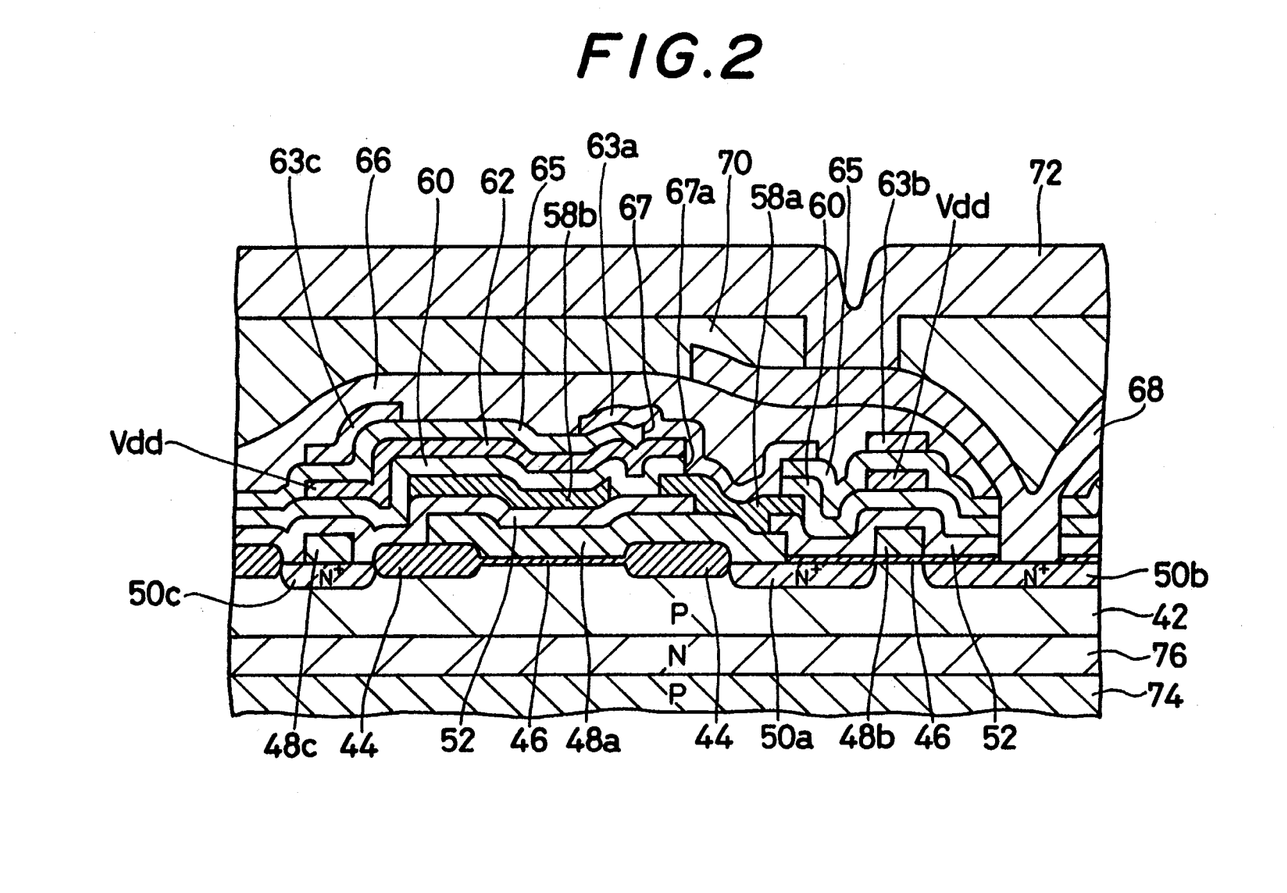
FIG. 2 is a sectional view showing the arrangement of a main part of an SRAM according to the present invention.

The memory cell of the SRAM of this embodiment has the circuit arrangement described above, and has a sectional structure shown in FIG. 2.

As shown in FIG. 2, in the SRAM of this embodiment, an N-well region 76 serving as an N-type impurity region is formed in the surface of a semiconductor substrate 74, and a P-well region 42 serving as a P-type impurity diffused-region is formed in the surface of the N-well region 76. A field insulator film 44 and a gate insulator film 46 are formed on the surface of the P-well region 42. Gate electrode layers 48a and 48b are formed on the surface of the gate insulator film 46.

The field insulator film 44 and the gate insulator film 46 consist of $SiO_2$ or the like. Although the thickness of the field insulator film 44 is not limited to a specific value, the field insulator film 44 has, e.g., a thickness of about 950 nm. Although the thickness of the gate insulator film 46 is not limited to a specific value, the gate insulator film 46 has, e.g., a thickness of about 40 nm. The gate electrode layers 48a and 48b are constituted by a polysilicon or polycide film having a multilayered structure consisting of silicide and polysilicon. When the gate electrode layers 48a and 48b are to be formed, a ground electrode layer 48c is formed by the same material as that of the gate electrode layers 48a and 48b.

$N^+$-type diffused layers 50a, 50b and 50c are formed on the surface of the P-well region 42 by an N-type impurity. The gate electrode layers 48a, 48b and 48c and the $N^+$-type diffused layers 50a, 50b and 50c serving as source/drain regions are arranged such that the pair of driver transistors Q1 and Q2 and the selector transistors Q3 and Q4 in the equivalent circuit of the memory cell of the SRAM shown in FIG. 3 are formed on the surface of the P-well region 42. In this embodiment, the driver transistors Q1 and Q2 and the selector transistors Q3 and Q4 are constituted by N-type MOS transistors.

In this embodiment, gate electrode layers 58a and 58b of TFTs are formed through an interlayer insulator 52 on the surface of the semiconductor substrate on which the gate electrode layers 48a, 48b and 48c are formed. Although the interlayer insulator 52 is not limited to a specific insulator, the interlayer insulator 52 is constituted by a silicon oxide or the like. Although the gate electrode layers 58a and 58b are not limited to a specific conductor, the gate electrode layers 58a and 58b are constituted by polysilicon films or the like. The thickness of the interlayer insulator 52 is, e.g., about 50 to 100 nm. The thickness of the polysilicon film constituting each of the gate electrode layers is, e.g., about 40 nm.

In this embodiment, since the TFTs serving as the load transistors are constituted by the P-type MOS transistors, a P-type impurity is doped in the gate electrode layers 58a and 58b constituted by polysilicon films or the like. The specific gate electrode layer 58a constituting the TFT is connected through a contact hole to the gate electrode layer 48a located on the lower layer side of the gate electrode layer 58a and on the substrate side because, as shown in FIG. 3, the gate electrode layers of the load transistors Q5 and Q6 constituted by the TFTs must be connected to the gate electrode layers of the driver transistors Q1 and Q2.

A gate insulator film 60 is grown on the gate electrode layers 58a and 58b of the TFTs. Although the gate insulator film 60 is not limited to a specific insulator, the gate insulator film 60 is constituted by a silicon oxide, an ONO film ($SiO_2/SiN/SiO_2$), or the like. Although the thickness of the gate insulator film 60 is not limited to a specific value, the thickness of the gate insulator film 60 is, e.g., about 25 nm.

A semiconductor layer 62 in which the channel regions and source/drain regions of the TFTs are formed is formed on the surface of the gate insulator film 60 to have a predetermined pattern. The semiconductor layer 62 is constituted by a polysilicon film having a thickness of, e.g., about 40 nm. Simultaneously with the formation of the semiconductor layer 62, a power supply line Vdd is formed by the polysilicon film constituting the semiconductor layer 62 to have a predetermined pattern.

An interlayer insulator 65 is formed on the surface of the semiconductor layer 62, and conductive layers 63a, 63b and 63c are stacked on the interlayer insulator 65. These conductive layers 63a, 63b and 63c are constituted by, e.g., polysilicon films. The conductive layer 63a has a function of connecting a part of the semiconductor layer 62 to the specific gate electrode layer 58a located on the low layer side of the semiconductor layer 62. In this manner, the part of the semiconductor layer 62 must be connected to the gate electrode layer 58a to form the SRAM memory cell circuit shown in FIG. 3.

In this embodiment, the semiconductor layer 62 is not directly connected to the specific gate electrode layer 58a located on the lower layer side of the semiconductor layer 62, but the semiconductor layer 62 is connected to the gate electrode layers 58a through the conductive layer 63a. Therefore, in processes for manufacturing an SRAM (to be described later), the surface of the gate insulator film 60 is not dipped in a light-etching solution when the contact portion of the semiconductor layer 62 is lightly etched. Therefore, the surface of the gate insulator film 60 is not roughened.

In this embodiment, since a part of the conductive layer 63a extends to the upper layer side of the semiconductor layer 62 through the interlayer insulator 65, the part of the conductive layer 63a can be used as a capacitor electrode layer for a storage node in an SRAM memory cell. Note that it is not preferable that the part of the conductive layer 63a extends to a position reaching the channel region of the semiconductor layer 62 because a channel operation may be adversely affected. However, when a conductive layer is formed simultaneously with the formation of the conductive layer 63a on the upper layer side of the channel region of the semiconductor layer 62 to be separated from the conductive layers 63a, the TFTs can have double-gate structures. In this case, the erroneous operations of the TFTs caused by the influence of other signal lines can be effectively prevented.

The conductive layers 63b and 63c formed simultaneously with the conductive layer 63a are used as the shunt lines of the power supply line Vdd. These conductive layers 63b and 63c are connected to the power supply line Vdd through contact holes arranged at intervals of 8 bits or 16 bits, and the conductive layers 63b and 63c function as shunt lines.

An interlayer insulator 66 is formed on the conductive layers 63a, 63b and 63c. A contact hole reaching the $N^+$-type diffused layer 50b is formed in the interlayer insulator 66, and a plug 68 consisting of a refractory metal such as tungsten is formed on the surface of the interlayer insulator 66 to be connected to the $N^+$-type diffused layer 50b through the contact hole. An interlayer insulator 70 is stacked on the interlayer insulator 66 including the plug 68, and a metal wiring layer 72 consisting of, e.g., aluminum is formed on the interlayer insulator 70. The metal wiring layer 72 is prospectively used as the bit line b or the inverting bit line b' shown in FIG. 3. A passivation film or the like is formed on the surface of the metal wiring layer 72, thereby constituting a memory cell of the SRAM.

A method of manufacturing the SRAM will be described below on the basis of FIGS. 4A to 4E.

Figure 4A:
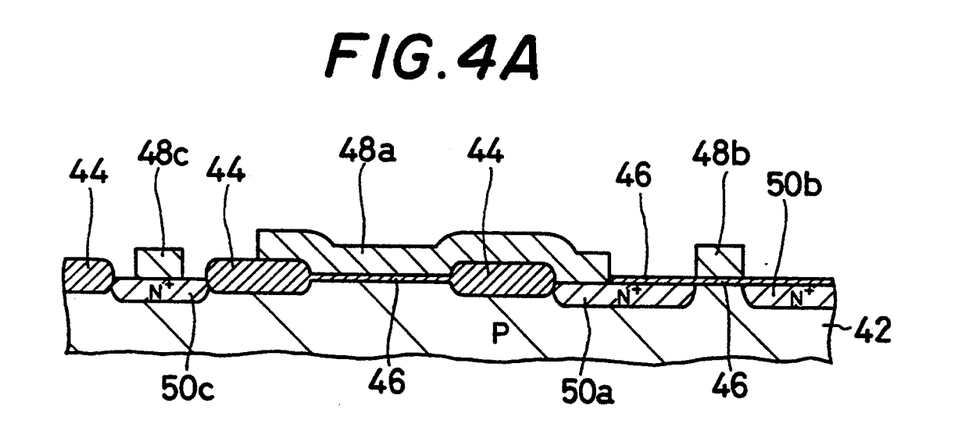
FIGS. 4A to 4E are sectional views schematically showing the steps in manufacturing the SRAM according to the present invention.

As shown in FIG. 4A, the P-well region 42 serving as a P-type impurity diffused region is formed in the surface of the semiconductor substrate, the field insulator film 44 and the gate insulator film 46 are formed on the surface of the P-well region 42. The gate electrode layers 48a and 48b are formed on the surface of the gate insulator film 46. The field insulator film 44 and the gate insulator film 46 are formed by thermally oxidizing the surface of the semiconductor substrate, and are constituted by e.g., $SiO_2$. Although the temperature of oxidation for forming the field insulator film is not limited to a specific value, the temperature is, e.g., about 1,000° C. The gate electrode layers 48a and 48b are constituted by polysilicon films formed by CVD, polycide films having multilayered structures each consisting of silicide and polysilicon, or the like. The ground electrode layer 48c is formed by the same material as that of the gate electrode layers 48a and 48b simultaneously with the formation of the gate electrode layers 48a and 48b.

The $N^+$-type diffused layers 50a, 50b and 50c are formed on the surface of the P-well region 42 by ion-implanting an N-type impurity to be self-aligned to the gate electrode layers 48a, 48b and 48c. The gate electrode layers 48a, 48b and 48c and the $N^+$-type diffused layers 50a, 50b and 50c serving as source/drain regions are formed in a pattern such that the pair of driver transistors Q1 and Q2 and the selector transistors Q3 and Q4 in the equivalent circuit of the memory cell of the SRAM shown in FIG. 3 are formed on the surface of the P-well region 42. As a result, the driver transistors Q1 and Q2 and the selector transistors Q3 and Q4 are constituted by N-type MOS transistors. An N-type impurity such as phosphorus (Phos) is doped in the gate electrode layers 48a, 48b and 48c constituted by polysilicon layers to increase the conductivities of the gate electrode layers 48a, 48b and 48c.

Figure 4B:
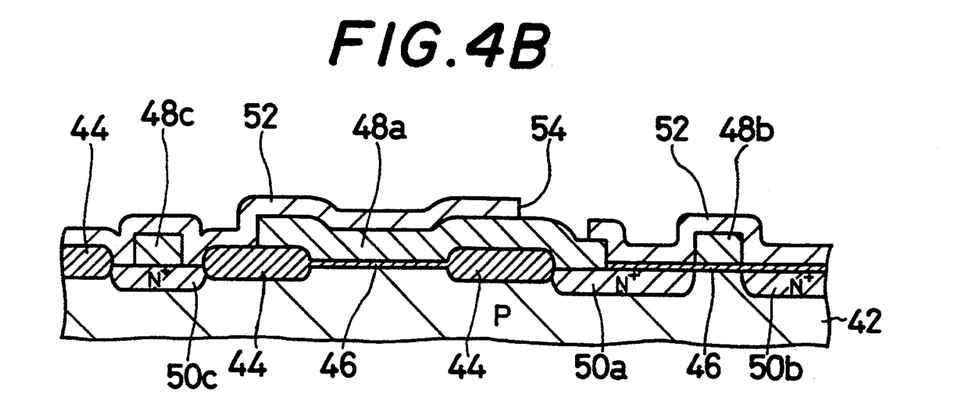

In this embodiment, as shown in FIG. 4B, the interlayer insulator 52 is formed on the surface of the semiconductor substrate on which the electrode layers 48a, 48b and 48c are formed. Although the interlayer insulator 52 is not limited to a specific insulator, the interlayer insulator 52 is constituted by an silicon oxide formed by CVD or the like. A contact hole 54 reaching the specific gate electrode layer 48a is formed in the interlayer insulator 52 by photolithography or the like because, in the memory cell of the SRAM, as shown in FIG. 3, the gate electrode layers of the load transistors Q5 and Q6 constituted by the TFTs must be connected to the gate electrode layers 48 of the driver transistors Q1 and Q2 formed on the surface of the semiconductor substrate. In addition, the specific gate electrode layer 48a is connected to the specific $N^+$-type diffused layer 50a because, as shown in FIG. 3, the gate electrode layer of the driver transistors Q1 and Q2 must be connected to the source/drain regions of the selector transistors Q3 and Q4.

Figure 4C:
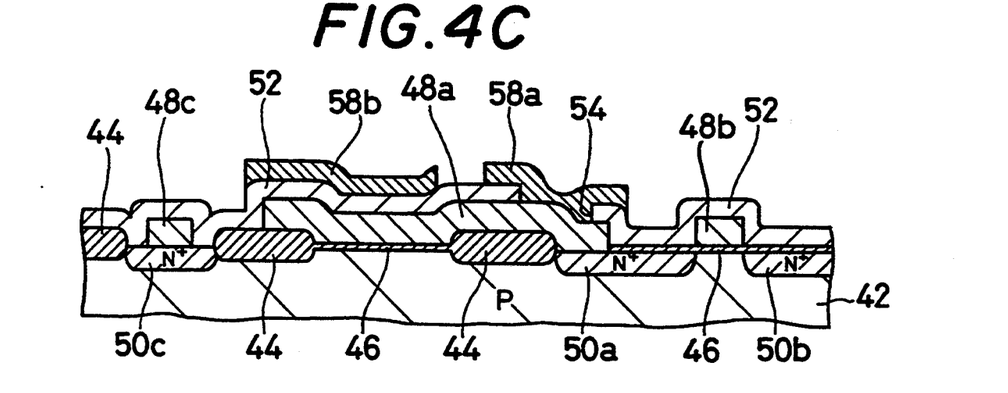

As shown in FIG. 4C, after the contact hole 54 is formed in the interlayer insulator 52, the gate electrode layers 58a and 58b of the TFTs are formed on the interlayer insulator 52 in a predetermined pattern such that the load transistors Q5 and Q6 of the SRAM memory cell shown in FIG. 3 are constituted. Although the gate electrode layers 58a and 58b are not limited to a specific conductor, the gate electrode layers 58a and 58b are constituted by, e.g., polysilicon films formed by CVD. In this embodiment, since the TFTs serving as the load transistors are constituted by P-type MOS transistors, a P-type impurity is doped in the gate electrode layers 58a and 58b constituted by polysilicon films or the like. The specific gate electrode layer 58a constituting the TFT is connected through the contact hole 54 to the gate electrode layer 48a located on the substrate side and on the lower layer side of the gate electrode layer 58a because, as shown in FIG. 3, the gate electrode layers of the load transistors Q5 and Q6 constituted by the TFTs must be connected to the gate electrode layers of the driver transistors Q1 and Q2.

Figure 4D:
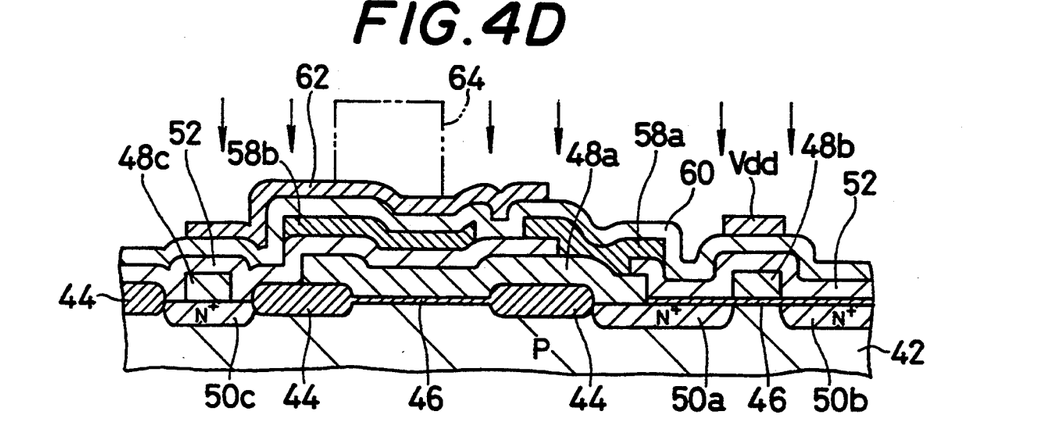

In this embodiment, as shown in FIG. 4D, a silicon oxide or an ONO film ($SiO_2/SiN/SiO_2$) constituting the gate insulator film 60 is formed on the surfaces of the gate electrode layers 58a and 58b by LP-CVD or the like.

The semiconductor layer 62, constituted by, e.g., a polysilicon film, on which the channel region and source/drain regions of the TFTs are formed is formed on the surface of the gate insulator film 60 by LP-CVD, and is etched in a predetermined pattern. The power supply line Vdd is formed in a predetermined pattern by the polysilicon film constituting the semiconductor layer 62 simultaneously with the formation of the semiconductor layer 62. In order to form the source/drain regions and the channel region on the semiconductor layer 62 constituted by the polysilicon, a portion of the semiconductor layer 62 corresponding to the channel region is masked with a resist film 64, and ion implantation for forming the source/drain regions is performed. As an impurity used for the ion implantation, a P-type impurity such as $BF_2$ to obtain a P-type MOSFET. In this ion implantation, ions are implanted to the polysilicon film constituting the power supply line Vdd to decrease the resistance of the power supply line Vdd.

In this embodiment, when the semiconductor layer 62 is formed, unlike the conventional technique, a contact hole connecting the specific gate electrode layer 58a need not be formed in a specific portion of the gate insulator film 60. As a result, photo-etching for removing a native oxide formed on the surface of the gate electrode layer 58a exposed in the contact hole need not be performed. Therefore, since the gate insulator film 60 is not dipped in a photo-etching solution, the gate insulator film can be effectively prevented from being roughened.

Figure 4E:
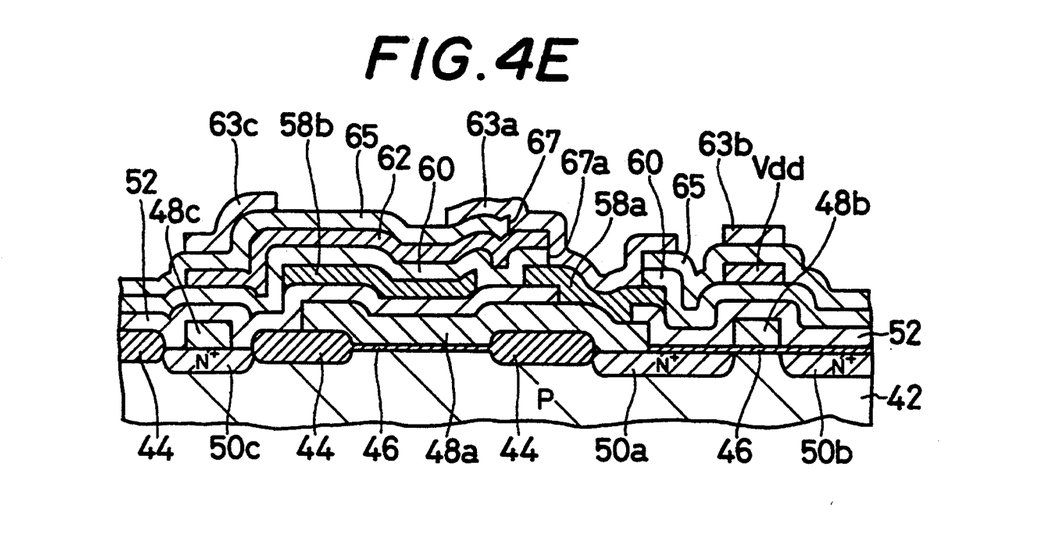

In this embodiment, after the source/drain regions are formed on the semiconductor layer 62, as shown in FIG. 4E, a silicon oxide constituting the interlayer insulator 65 is formed on the surface of the semiconductor layer 62 by LP-CVD or the like. The thickness of the silicon oxide is not limited to a specific value. A contact hole 67 is formed in the interlayer insulator 65 by etching or the like. The contact hole 67 is formed at a position where a portion between the semiconductor layer 62 and a portion of the specific gate electrode layer 58a is exposed. When the contact hole 67 is formed, a contact hole 67a is also formed in the gate insulator film 60 located under the semiconductor layer 62 to expose the upper surface of the gate electrode layer 58a.

In this embodiment, a polysilicon film is formed on the interlayer insulator 65 by, e.g., LP-CVD to be inserted in the contact hole 67, and this polysilicon film is etched in a predetermined pattern to form the conductive layers 63a, 63b and 63c. An impurity is doped in the polysilicon layer constituting the conductive layers as needed to decrease the resistances of the conductive layers. Although the thickness of each of the conductive layers is not limited to a specific value, the thickness is almost equal to that of the semiconductor layer 62.

The conductive layer 63a has an operation of connecting a portion of the semiconductor layer 62 to the specific gate electrode layer 58a located on the lower layer side of the semiconductor layer 62, and the conductive layer 63a is operated as a capacitor electrode layer for a storage node in the SRAM memory cell. In addition, the conductive layers 63b and 63c are operated as the shunt lines of the power supply line Vdd.

As shown in FIG. 2, the interlayer insulator 66 is formed on the conductive layers 63a, 63b and 63c, and a contact hole reaching the N+-type diffused layer 50c is formed in the interlayer insulator 66. The plug 68 consisting of a refractory metal such as tungsten is formed on the surface of the interlayer insulator 66 to be connected to the N+-type diffused layer 50c, the interlayer insulator 70 is stacked on the interlayer insulator 66 including the plug 68, and the metal wiring layer 72 consisting of, e.g., aluminum is formed on the interlayer insulator 70. This metal wiring layer 72 is used as the bit line b or the inverting bit line b' shown in FIG. 3. A passivation film or the like is formed on the surface of the metal wiring layer 72, thereby manufacturing an SRAM.

In addition, an embodiment related to a method of manufacturing a semiconductor device in which a transistor having a gate insulator film thicker than that of a memory cell is integrally formed around a memory portion will be described below with reference to FIGS. 5A to 5F.

Figure 5A:
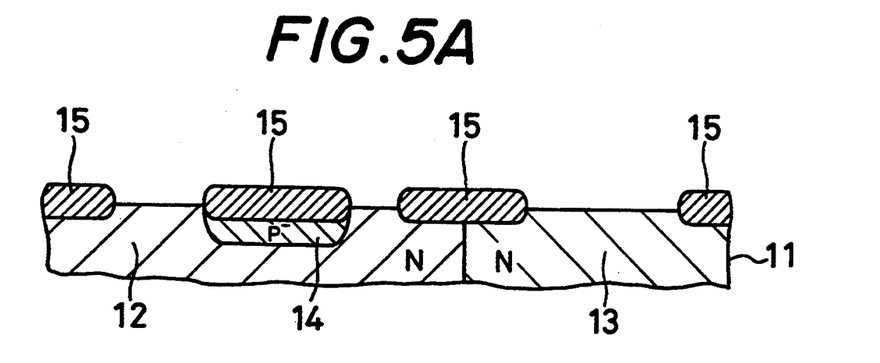
FIGS. 5A to 5F are sectional side views showing the steps in manufacturing a semiconductor device having different gate insulator films according to the present invention.
Figure 5B:
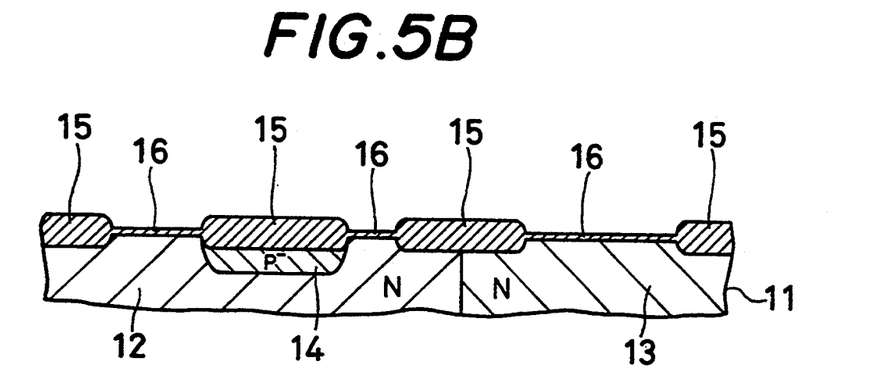
Figure 5C:
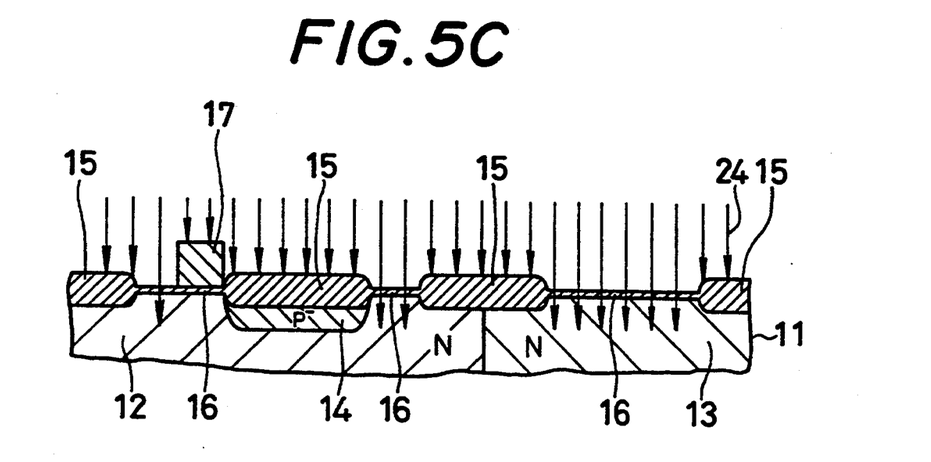

In this embodiment, as shown in FIGS. 5A to 5C, the steps up to the step of patterning a resist 17 to cover only a region in which the gate oxide of a high voltage transistor is to be formed on an $SiO_2$ film 16, i.e., a region to be a channel region, are substantially the same as those of the prior art described above.

Figure 5D:
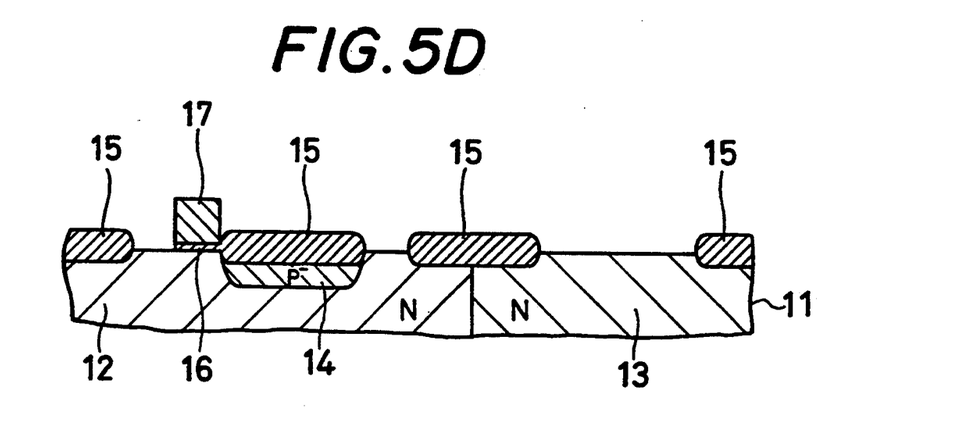

In this embodiment, as shown in FIG. 5C, in this state, boron 24 is immediately ion-implanted in a Si substrate 11 using the resist 17 and an $SiO_2$ film 15 as masks to control the threshold voltage of a normal transistor to be formed in a well 13. As shown in FIG. 5D, the resultant structure is etched using the resist 17 as a mask to selectively remove the $SiO_2$ film 16.

Figure 5E:
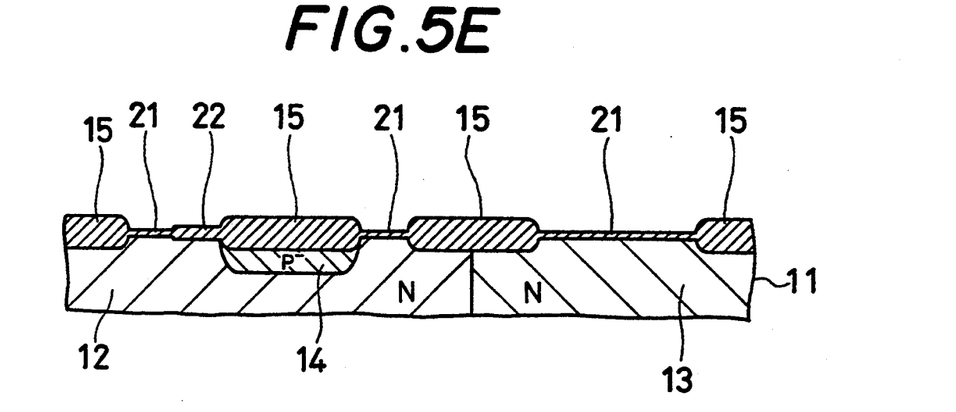
Figure 5F:
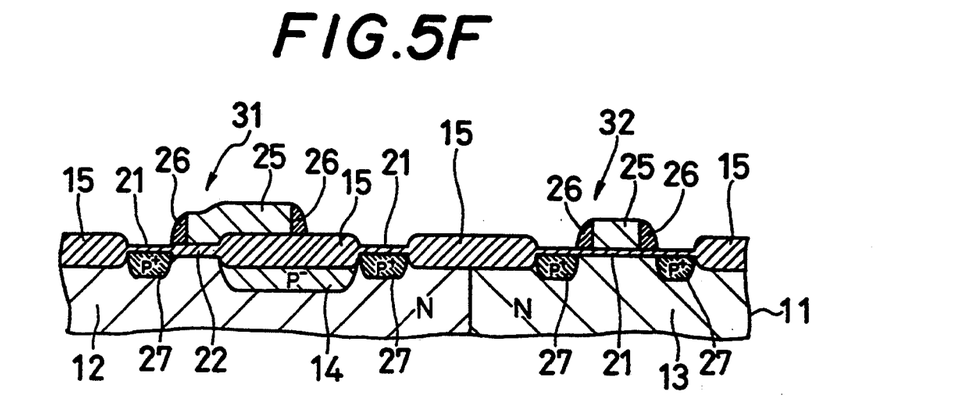

After the resist 17 is removed, gate oxidation is performed again to form an $SiO_2$ film 21 having a thickness of about 200 Å in a region from which the $SiO_2$ film 16 is removed as shown in FIG. 5E. At the same time, an $SiO_2$ film 22 having a thickness of about 300 Å is formed by the remaining $SiO_2$ film 16. Thereafter, the same step as that of the prior art shown in FIG. 1F is performed, as shown in FIG. 5F, to form a high voltage transistor 31 and a normal transistor 32 in a well 12 and the well 13, respectively.

In the embodiment described above, as is apparent from the steps in FIGS. 5C to 5E, after the boron 24 is ion-implanted to control the threshold voltage, the gate oxidation is performed, thereby forming the $SiO_2$ film 21. For this reason, the $SiO_2$ film 21 is not damaged by the ion implantation of the boron 24, and the insulation breakdown voltage of the $SiO_2$ film 21 is not easily decreased. Note that the decrease in insulation breakdown voltage caused by the damage in the ion implantation is particularly conspicuous when the thickness of the $SiO_2$ film 21 is decreased to micropattern the normal transistor 32 and the like.

Although various minor changes and modifications might be proposed by those skilled in the art, it will be understood that we wish to include within the scope of the patent warranted hereon all such changes and modifications as reasonably come within our contribution to the art.

What is claimed is:

1. A semiconductor device, comprising:
   a thin film transistor formed by a gate insulator film stacked on a first gate electrode layer and a semiconductor layer stacked on the gate insulator film;
   a portion of said semiconductor layer being electrically connected by a conductive layer to a second gate electrode layer through a contact hole formed in said gate insulator layer; and
   an insulator layer inserted between a portion of said conductive layer and said semiconductor layer; and
   said thin film transistor comprising a load transistor of a SRAM memory cell, one end of said semiconductor layer merging into a power supply line connected to said load transistor, and an additional conductive layer portion arranged over said power supply line comprising a shunt line of the power supply line.

* * * * *